US011237198B2

United States Patent
Liu et al.

(10) Patent No.: US 11,237,198 B2
(45) Date of Patent: Feb. 1, 2022

(54) EMC TEST SYSTEM FOR ROTATING LOAD AND A TEST METHOD THEREOF

(71) Applicant: ZHUHAI ENPOWER ELECTRIC CO., LTD., Zhuhai (CN)

(72) Inventors: Hongxin Liu, Zhuhai (CN); Hongyu Li, Zhuhai (CN)

(73) Assignee: ZHUHAI EMPOWER ELECTRIC CO., LTD., Zhuhai (CN)

( * ) Notice: Subject to any disclaimer, the term of this patent is extended or adjusted under 35 U.S.C. 154(b) by 0 days.

(21) Appl. No.: 17/046,806

(22) PCT Filed: Apr. 17, 2019

(86) PCT No.: PCT/CN2019/082988
§ 371 (c)(1),
(2) Date: Oct. 12, 2020

(87) PCT Pub. No.: WO2019/201266
PCT Pub. Date: Oct. 24, 2019

(65) Prior Publication Data
US 2021/0080496 A1    Mar. 18, 2021

(30) Foreign Application Priority Data

Apr. 17, 2018    (CN) .......................... 201810341110.2

(51) Int. Cl.
*H01H 31/02*    (2006.01)
*G01R 31/00*    (2006.01)
(Continued)

(52) U.S. Cl.
CPC ........... *G01R 31/001* (2013.01); *G01M 15/02* (2013.01); *G01R 29/0821* (2013.01); *G01R 31/1263* (2013.01)

(58) Field of Classification Search
CPC ............ G01R 29/0821; G01R 29/0878; G01R 31/001; G01R 31/002; G01R 31/0026;
(Continued)

(56) References Cited

U.S. PATENT DOCUMENTS 6,023,890 A  *  2/2000  Zenobi .................. G01M 15/02
                                                                52/64
9,291,677 B1 *  3/2016  Korpi ................... G01R 31/343
(Continued)

FOREIGN PATENT DOCUMENTS

CN        202187977 U      4/2012
CN        104101803 A     10/2014
(Continued)

*Primary Examiner* — Thang X Le
(74) *Attorney, Agent, or Firm* — Bayramoglu Law Offices LLC

(57) ABSTRACT

An EMC test system for a rotating load includes a shielded chamber, a rotating load, a first connecting shaft, a compressor, a fluid pipeline, a fluid motor, a second connecting shaft and a motor load. The rotating load, the first connecting shaft and the compressor are arranged inside the shielded chamber. The fluid motor, the second connecting shaft and the motor load are arranged outside the shielded chamber. The rotating load is connected to the compressor through the first connecting shaft. The compressor is connected to the fluid motor through the fluid pipeline. The fluid motor is connected to the motor load through the second connecting shaft. The fluid pipeline passes through the shielded chamber. The compressor is employed such that energy is transferred to the outdoors through the transmission of fluid, and then converted into electric energy.

20 Claims, 1 Drawing Sheet

(51) Int. Cl.
*G01M 15/02* (2006.01)
*G01R 29/08* (2006.01)
*G01R 31/12* (2020.01)

(58) Field of Classification Search
CPC .............. G01R 31/1263; G01R 31/305; G01R 31/309; G01R 31/311; G01R 31/343; G01M 15/02
USPC ........................................................ 324/555
See application file for complete search history.

(56) References Cited

U.S. PATENT DOCUMENTS

2012/0168008 A1\* 7/2012 Lo ........................... G01L 19/12
                                                                                                  137/551
2019/0368974 A1\* 12/2019 Cariveau ............... F04C 13/008

FOREIGN PATENT DOCUMENTS

| CN | 205749730 U | 11/2016 |
| CN | 108333456 A | 7/2018 |
| CN | 208156096 U | 11/2018 |
| WO | 2017088853 A1 | 6/2017 |
| WO | WO 2017088853 \* | 6/2017 |

\* cited by examiner

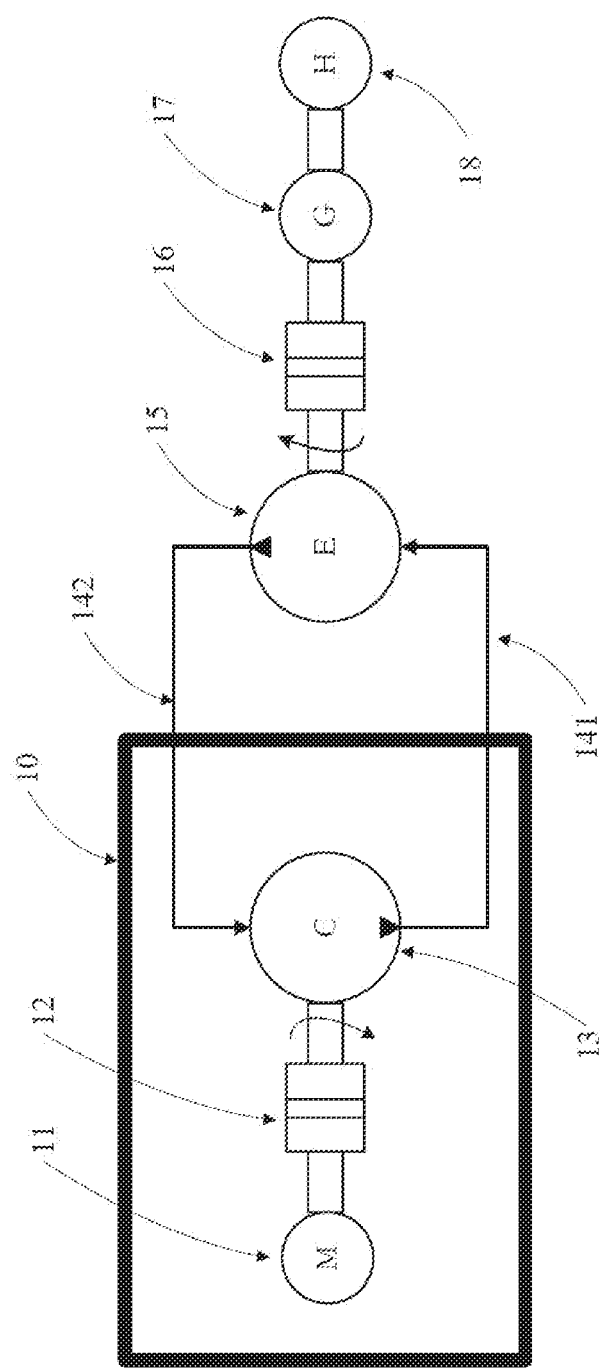

EMC TEST SYSTEM FOR ROTATING LOAD AND A TEST METHOD THEREOF

CROSS REFERENCE TO THE RELATED APPLICATIONS

This application is the national phase entry of International Application No. PCT/CN2019/082988, filed on Apr. 17, 2019, which is based upon and claims priority to Chinese Patent Application No. 201810341110.2, filed on Apr. 17, 2018, the entire contents of which are incorporated herein by reference.

TECHNICAL FIELD

The present invention relates to the field of electromagnetic compatibility (EMC) testing, and more particularly, to an EMC test system for a rotating load and a test method thereof.

BACKGROUND

At present, in EMC tests all over the world, when an anechoic chamber for shielding is used in the EMC test, a mechanical load is typically applied when testing rotating loads such as motors. To accurately test the EMC level of the equipment under test, the applied load without radiation and interference generated and transmitted in the test is desired.

In one of the commonly used methods in the prior art, mechanical shafts such as ceramic shafts made of non-magnetic conductive materials are employed to transmit the torque of the motor load through the EMC shielded chamber to an electronic load device such as a generator set. This method is simple, but relies on very expensive mechanical equipment and costly construction of the shielded chamber, which is beyond the reach of ordinary companies.

In another commonly used method, an integrated mechanical load device with a shielded housing outside is employed to meet the EMC testing requirements for ambient noise. This method is less costly compared with the aforementioned method, but involves a more complicated process in testing and installation. As a result, improper installation is prone to a penetration of radiation and interference, which causes unreliable test results. Consequently, the test needs to be reworked, which reduces the test efficiency.

SUMMARY

Technical Problems

The first objective of the present invention is to provide an EMC test system for a rotating load, which has optimal test accuracy and is less expensive.

The second objective of the present invention is to provide a test method of the EMC test system for the rotating load, which has optimal test accuracy and is less expensive.

Technical Solutions

To achieve the first objective of the present invention, the present invention provides an EMC test system for a rotating load, including a shielded chamber, a rotating load, a first connecting shaft, a compressor, a fluid pipeline, a fluid motor, a second connecting shaft and a motor load. The rotating load, the first connecting shaft and the compressor are arranged inside the shielded chamber. The fluid motor, the second connecting shaft and the motor load are arranged outside the shielded chamber. The rotating load is connected to the compressor through the first connecting shaft. The compressor is connected to the fluid motor through the fluid pipeline. The fluid motor is connected to the motor load through the second connecting shaft. The fluid pipeline passes through the shielded chamber.

Further, the fluid pipeline is made of a non-magnetic conductive material.

Further, the fluid pipeline is a plastic pipe, a rubber pipe or a nylon pipe.

Further, the fluid pipeline is arranged in a recirculation configuration, and the fluid pipeline includes an output pipeline and an input pipeline. The output pipeline and the input pipeline pass through the shielded chamber, respectively. The output pipeline and the input pipeline are connected between the compressor and the fluid motor, respectively.

Further, the EMC test system is further provided with a consumption load outside the shielded chamber, and the consumption load is connected to the motor load.

Further, the fluid pipeline is configured to transport gas, and the fluid motor is a pneumatic motor.

Further, the fluid pipeline is configured to transport liquid, and the fluid motor is a hydraulic motor.

To achieve the second objective of the present invention, the present invention provides a test method of the EMC test system for rotating load mentioned above, and the test method includes:

rotating the rotating load to drive the compressor to rotate through the first connecting shaft;

generating a positive pressure for a fluid through the compressor, wherein the fluid flows from the inside of the shielded chamber to the outside of the shielded chamber through the fluid pipeline, and the fluid is introduced to the fluid motor to drive the fluid motor to rotate; and driving the motor load to rotate through the fluid motor and the second connecting shaft.

Advantages

According to the EMC test system and the test method provided by the present invention, the rotating load placed in an EMC anechoic chamber, that is, the shielded chamber, is connected to the compressor through a connecting shaft, and drives the compressor to be connected to the outdoors through a shielded tunnel via the fluid pipeline. The fluid motor is connected outdoors to the motor load and drives the motor load to rotate, so that mechanical energy is transferred to the outdoors through the compressor and the fluid pipeline. The compressor is employed, whereby the energy is transferred to the outdoors through the fluid method, and then converted into electric energy. In this way, the problem of EMC interference caused by the electromagnetic load is overcome, without expensive non-metallic connecting shafts required for mechanical transmission, and thus the test system of the present invention not only has optimal test accuracy but also is less expensive than heretofore systems.

Moreover, the fluid pipeline is made of a non-magnetic conductive material to improve the test accuracy.

Furthermore, the consumption load is added to increase energy consumption, which is suitable for various test applications according to this technical solution.

Additionally, the objectives of the present invention can be achieved when the fluid is either a gas or a liquid, and the gas or liquid is a non-magnetic conductive medium to satisfy the EMC test requirements for ambient noise.

BRIEF DESCRIPTION OF THE DRAWING

FIGURE is a schematic diagram showing the EMC test system of the present invention.

The present invention will be further described below with reference to the drawings and embodiments.

DETAILED DESCRIPTION OF THE EMBODIMENTS

FIGURE schematically shows the EMC test system of the present invention suitable for the rotating load 11. The rotating load 11 is a motor, a generator or other rotating loads that can be applied to the present invention. The EMC test system includes the shielded chamber 10, the rotating load 11, the first connecting shaft 12, the compressor 13, the fluid pipeline, the fluid motor 15, the second connecting shaft 16, the motor load 17, and the consumption load 18. The shielded chamber 10 can also be an EMC anechoic chamber. The rotating load 11, the first connecting shaft 12 and the compressor 13 are arranged inside the shielded chamber 10. The rotating load 11 is connected to the compressor 13 through the first connecting shaft 12. The first connecting shaft 12 is a conventional transmission mechanism without the need for special material transmission. The compressor 13 is driven to work through the rotation of the rotating load 11 and the transmission of the connecting shaft.

The fluid motor 15, the second connecting shaft 16 and the motor load 17 are arranged outside the shielded chamber 10. The compressor 13 is connected to the fluid motor 15 through a fluid pipeline. The fluid pipeline is made of a non-magnetic conductive material.

The fluid pipeline is a plastic pipe, a rubber pipe or a nylon pipe. The fluid pipeline is arranged in a recirculation configuration, and includes the output pipeline 141 and the input pipeline 142. The output pipeline 141 and the input pipeline 142 are respectively connected to the outside of the shielded chamber 10 through a shielded tunnel. The output pipeline 141 and the input pipeline 142 are connected between the compressor 13 and the fluid motor 15, respectively. When working, the compressor 13 provides a positive pressure for a fluid and outputs the fluid through the output pipeline 141. Then the fluid can drive the fluid motor 15 to work, and the fluid can be recovered from the input pipeline 142.

The fluid pipeline is configured to transport gas, and the fluid motor 15 is a pneumatic motor to realize the technical solution of the present invention through the transmission of gas. Alternatively, the fluid pipeline can also be configured to transport liquid, and the fluid motor 15 is a hydraulic motor to realize the technical solution of the present invention through the transmission of liquid, which includes hydraulic transmission, oil pressure transmission, etc.

The outdoor fluid motor 15 is connected to the motor load 17 through the second connecting shaft 16, and the consumption load 18 is connected to the motor load 17, thereby realizing energy consumption. In terms of energy consumption, the motor load 17 can be used alone, namely, the motor load 17 is a mechanical load such as a magnetic powder brake or a motor. The motor then drives a resistive load, or a green load with feedback, and the green load is connected to a power grid through an active inverter.

A test method of the EMC test system under test includes:
the rotating load 11 is rotated to drive the compressor 13 to rotate through the first connecting shaft 12;
the compressor 13 generates a positive pressure for the fluid, the fluid flows from the inside of the shielded chamber 10 to the outside of the shielded chamber 10 through the transmission of the fluid pipeline, and the fluid is introduced to the fluid motor 15 and drives the fluid motor 15 to rotate;
the fluid motor 15 drives the motor load 17 to rotate through the second connecting shaft 16;
the motor load 17 drives the consumption load 18 to rotate to realize energy consumption; and
the test equipment located in the shielded chamber 10 acquires and tests relevant EMC data.

INDUSTRIAL APPLICABILITY

The EMC test system and test method of the present invention are suitable for the field of EMC testing. The compressor is employed, whereby the energy is transferred to the outdoors through the transmission of fluid, and then converted into electric energy, which avoids the problem of EMC interference caused by electromagnetic loads. In this way, the test system of the present invention not only has optimal test accuracy but also is less expensive than existing systems.

What is claimed is:

1. An EMC test system for a rotating load, comprising a shielded chamber, the rotating load, a first connecting shaft, a compressor, a fluid pipeline, a fluid motor, a second connecting shaft, and a motor load; wherein
the rotating load, the first connecting shaft and the compressor are arranged inside the shielded chamber;
the fluid motor, the second connecting shaft and the motor load are arranged outside the shielded chamber;
the rotating load is connected to the compressor through the first connecting shaft;
the compressor is connected to the fluid motor through the fluid pipeline;
the fluid motor is connected to the motor load through the second connecting shaft; fluid is introduced to the fluid motor and drives the fluid motor to rotate such that the fluid motor drives the motor load to rotate through the second connecting shaft; and
the fluid pipeline passes through the shielded chamber.

2. The EMC test system according to claim 1, wherein, the fluid pipeline is made of a non-magnetic conductive material.

3. The EMC test system according to claim 2, wherein, the fluid pipeline is one selected from the group consisting of a plastic pipe, a rubber pipe and a nylon pipe.

4. The EMC test system according to claim 3, wherein, the fluid pipeline is arranged in a recirculation configuration;
the fluid pipeline comprises an output pipeline and an input pipeline;
the output pipeline and the input pipeline separately pass through the shielded chamber; and
the output pipeline and the input pipeline are connected separately between the compressor and the fluid motor.

5. The EMC test system according to claim 1, wherein, the EMC test system is further provided with a consumption load outside the shielded chamber, and the consumption load is connected to the motor load.

6. The EMC test system according to claim 1, wherein, the fluid pipeline is configured to transport a gas, and the fluid motor is a pneumatic motor.

7. The EMC test system according to claim 1, wherein, the fluid pipeline is configured to transport a liquid, and the fluid motor is a hydraulic motor.

8. A test method of the EMC test system according to claim 1, comprising:
   rotating the rotating load to drive the compressor to rotate through the first connecting shaft; and
   generating a positive pressure for a fluid through the compressor, wherein the fluid flows from an inside of the shielded chamber to an outside of the shielded chamber through the fluid pipeline, and the fluid is introduced to the fluid motor to drive the fluid motor to rotate; and the fluid motor drives the motor load to rotate through the second connecting shaft.

9. The EMC test system according to claim 2, wherein, the fluid pipeline is configured to transport a gas, and the fluid motor is a pneumatic motor.

10. The EMC test system according to claim 3, wherein, the fluid pipeline is configured to transport a gas, and the fluid motor is a pneumatic motor.

11. The EMC test system according to claim 4, wherein, the fluid pipeline is configured to transport a gas, and the fluid motor is a pneumatic motor.

12. The EMC test system according to claim 5, wherein, the fluid pipeline is configured to transport a gas, and the fluid motor is a pneumatic motor.

13. The EMC test system according to claim 2, wherein, the fluid pipeline is configured to transport a liquid, and the fluid motor is a hydraulic motor.

14. The EMC test system according to claim 3, wherein, the fluid pipeline is configured to transport a liquid, and the fluid motor is a hydraulic motor.

15. The EMC test system according to claim 4, wherein, the fluid pipeline is configured to transport a liquid, and the fluid motor is a hydraulic motor.

16. The EMC test system according to claim 5, wherein, the fluid pipeline is configured to transport a liquid, and the fluid motor is a hydraulic motor.

17. The test method according to claim 8, wherein, the fluid pipeline is made of a non-magnetic conductive material.

18. The test method according to claim 17, wherein, the fluid pipeline is one selected from the group consisting of a plastic pipe, a rubber pipe and a nylon pipe.

19. The test method according to claim 18, wherein,
the fluid pipeline is arranged in a recirculation configuration;
the fluid pipeline comprises an output pipeline and an input pipeline;
the output pipeline and the input pipeline separately pass through the shielded chamber; and
the output pipeline and the input pipeline are connected separately between the compressor and the fluid motor.

20. The test method according to claim 8, wherein, the EMC test system is further provided with a consumption load outside the shielded chamber, and the consumption load is connected to the motor load.

\* \* \* \* \*

UNITED STATES PATENT AND TRADEMARK OFFICE
CERTIFICATE OF CORRECTION

PATENT NO. : 11,237,198 B2  
APPLICATION NO. : 17/046806  
DATED : February 1, 2022  
INVENTOR(S) : Liu et al.

Page 1 of 1

It is certified that error appears in the above-identified patent and that said Letters Patent is hereby corrected as shown below:

On the Title Page

Item (73) Assignee should read ZHUHAI ENPOWER ELECTRIC CO., LTD., Zhuhai (CN)

Signed and Sealed this  
Twenty-first Day of June, 2022

Katherine Kelly Vidal  
*Director of the United States Patent and Trademark Office*